US006975006B2

(12) United States Patent
Huang et al.

(10) Patent No.: US 6,975,006 B2
(45) Date of Patent: Dec. 13, 2005

(54) SEMICONDUCTOR DEVICE WITH MODIFIED CHANNEL COMPRESSIVE STRESS

(75) Inventors: Chien-Chao Huang, Hsin-Chu (TW); Tone-Xuan Chung, Kaohsiung (TW); Cheng-Chuan Huang, Kinmen (TW); Fu-Liang Yang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/627,849

(22) Filed: Jul. 25, 2003

(65) Prior Publication Data

US 2005/0019998 A1 Jan. 27, 2005

(51) Int. Cl.[7] .............................................. H01L 31/119
(52) U.S. Cl. ........................ 257/410; 257/411; 257/412
(58) Field of Search ................................ 257/412–413, 257/410, 340–346, 387; 438/595, 303–304, 660–664, 682–685

(56) References Cited

U.S. PATENT DOCUMENTS

| | | | | |
|---|---|---|---|---|
| 5,783,475 A | * | 7/1998 | Ramaswami | ................ 438/303 |
| 6,013,569 A | * | 1/2000 | Lur et al. | .................... 438/595 |
| 6,512,266 B1 | * | 1/2003 | Deshpande et al. | ......... 257/333 |
| 6,521,964 B1 | * | 2/2003 | Jan et al. | ..................... 257/413 |
| 6,551,887 B2 | * | 4/2003 | Kwon et al. | ................. 438/305 |
| 6,746,927 B2 | * | 6/2004 | Kammler et al. | ........... 438/303 |

OTHER PUBLICATIONS

Ootsuka, F., et al., "A High Dense, High–Performance 130nm node CMOS Technology for Large Scale System–on–a–Chip Applications", IDEM 00, IEEE 0–7803–6438, (Apr. 2000), pp. 575–578.

Tiwari, S., et al. "Hole Mobility Improvement in Silicon–on–Insulator and Bulk Silicon Transistors Using Local Strain", IDEM 97, (Apr. 2000), pp. 939–941.

* cited by examiner

*Primary Examiner*—Dung A. Le
(74) *Attorney, Agent, or Firm*—Duane Morris LLP

(57) ABSTRACT

A semiconductor device includes a substrate and a gate region on top of a substrate. First and second gate sidewall liners are situated on first and second sides of the gate region respectively, the first and second sidewall liners having a vertical part contacting sidewalls of the gate region and a horizontal part contacting the substrate. First and second recessed spacers are situated on top of the first and second sidewall liners respectively. The height of the first and second spacers is lower than the height of the gate sidewall liner whereas the width of the horizontal part of the sidewall liner is shorter than the width of the spacer.

12 Claims, 5 Drawing Sheets

SEMICONDUCTOR DEVICE WITH MODIFIED CHANNEL COMPRESSIVE STRESS

BACKGROUND

The present disclosure relates to the fabrication of field-effect transistors in an integrated circuit, and more particularly, relates to methods for modifying mechanical stresses induced upon the transistors' gate channel during the fabrication of transistors which feature the use of sidewall spacers on the transistor gate structures.

Very large scale integrated (VLSI) circuits using field effect transistors (FET) experience problems with the trapping of hot or energetic electrons to affect the lateral electrical field strength and carrier mobility in the transistor gate regions, particularly in the regions adjacent to the device source and drain. As transistor geometric sizing and distances scale down, carrier mobility and channel hot electrons within the FET devices begin to experience greater levels of instability. Many factors can influence this carrier mobility and electron stability. These factors (including substrate structure, substrate doping, source/drain dopant junctions) and gate channel dimensions can be adjustable to some extent during the fabrication of these circuits.

FIG. 1 illustrates a cross-sectional view of a field-effect transistor 100 featuring the use of sidewall spacer films to allow adjustments of the transistors' source/drain dopant junctions. The transistor's gate region comprising of the gate electrode 102, gate sidewall liners 103, and gate oxide 104 is formed on top of a substrate 105. The gate sidewall liners 103 are situated along the side walls of the gate electrode and extends outward to some length from the gate electrode. As shown, the transistor 100 is built upon the semiconductor substrate 105 with isolation structures 106a and 106b formed to provide electrical isolation between transistors. The area in the substrate 105 under the gate region is the transistor's gate channel. Sidewall spacers 108a and 108b are situated adjacent to the sidewall liners such that the sidewall liners are located directly between the spacers and gate region with the top of the spacers sloping down from the top of the gate sidewall liner to the outer edge of the sidewall liner extension that extends along the substrate from the gate electrode.

Although the spacers 108a and 108b offers much improvement for FET control and stability, there is a negative aspect to their use. The stress from the spacers combined with the stress from films subsequently formed on top of the transistor induced upon the gate region will affect the carrier and electron mobility along the gate channel. FIG. 2 illustrates the relationship between the transistor drain current (Id) flow versus stress applied onto the transistor gate channel region for an n-channel metal-oxide-silicon (NMOS) field-effect transistor. Specifically, for NMOS field-effect transistors, drive current improves with reduced stress in the gate channel. Stress affects upon transistor performance, usually accounted for during characterizations of the fabrication processes, have become a larger and more difficult issue as transistor geometric sizing and distances continue to scale down. It has become increasingly more desirable to address the controllability of and levels of stress induced by the spacer layer and subsequent layers on top of the gate region.

What is needed is an improved device with reduced channel stress when the spacers are used.

SUMMARY

A semiconductor device and the method for making same is disclosed. The semiconductor device has a substrate and a gate region on top of the substrate. It further has a first and second gate sidewall liners situated on a first and second sides of the gate region respectively, the first and second sidewall liners having a vertical part contacting sidewalls of the gate region and a horizontal part contacting the substrate; and a first and second recessed spacers situated on top of the first and second sidewall liners respectively, wherein a height of the first and second spacers is lower than a height of the gate sidewall liner and wherein the width of the horizontal part of the sidewall liner is shorter than the width of the spacer.

A method is disclosed for fabricating at least one semiconductor device having a gate region and recessed spacers for reducing channel stress. After forming a substrate, a gate region is formed on top of the substrate, the gate region having a gate electrode and a gate oxide region. Two sidewall liners are then formed confining the gate region therebetween, and two spacers are formed on top of the sidewall liners on both sides of the gate region, the height of the spacers matching substantially the height of the sidewall liners. The width of the sidewall liners are shortened so that it is shorter than the spacers on top thereof. Two recessed spacers are formed by reducing the height of the formed spacers, wherein the reduced spacer height reduces device channel stress. The channel stress can further be modified with a contact etching stopper layer placed over the spacers.

These and other aspects and advantages will become apparent from the following detailed description, taken in conjunction with the accompanying drawings, illustrating by way of example the principles of the disclosure.

DESCRIPTION

A transistor with modified channel stress and the method for manufacturing same is introduced.

Figure 1:
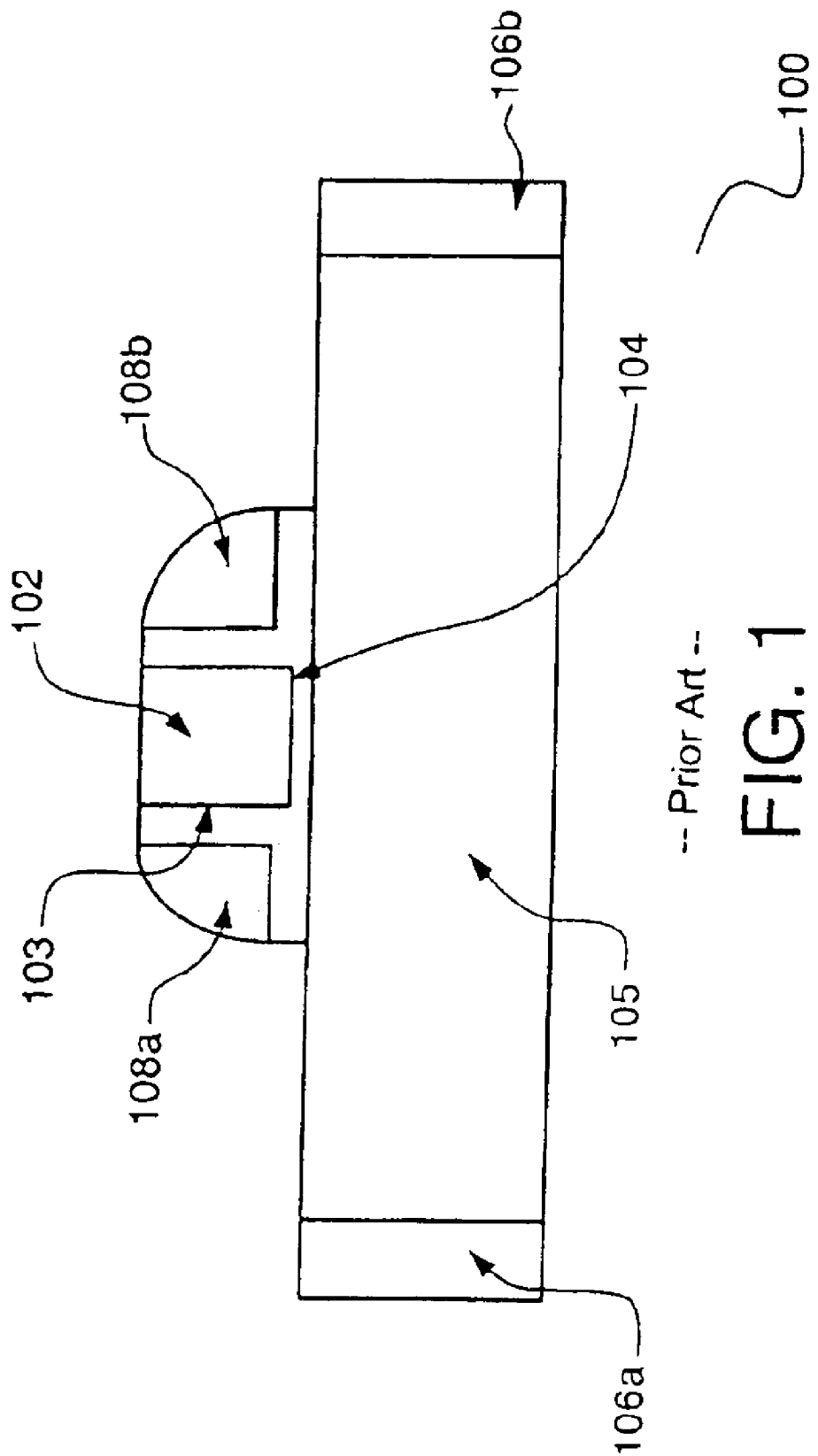
FIG. 1 illustrates a cross-sectional side view of a metal-oxide-silicon field-effect transistor (MOSFET) produced by conventional methods with spacers.
Figure 2:
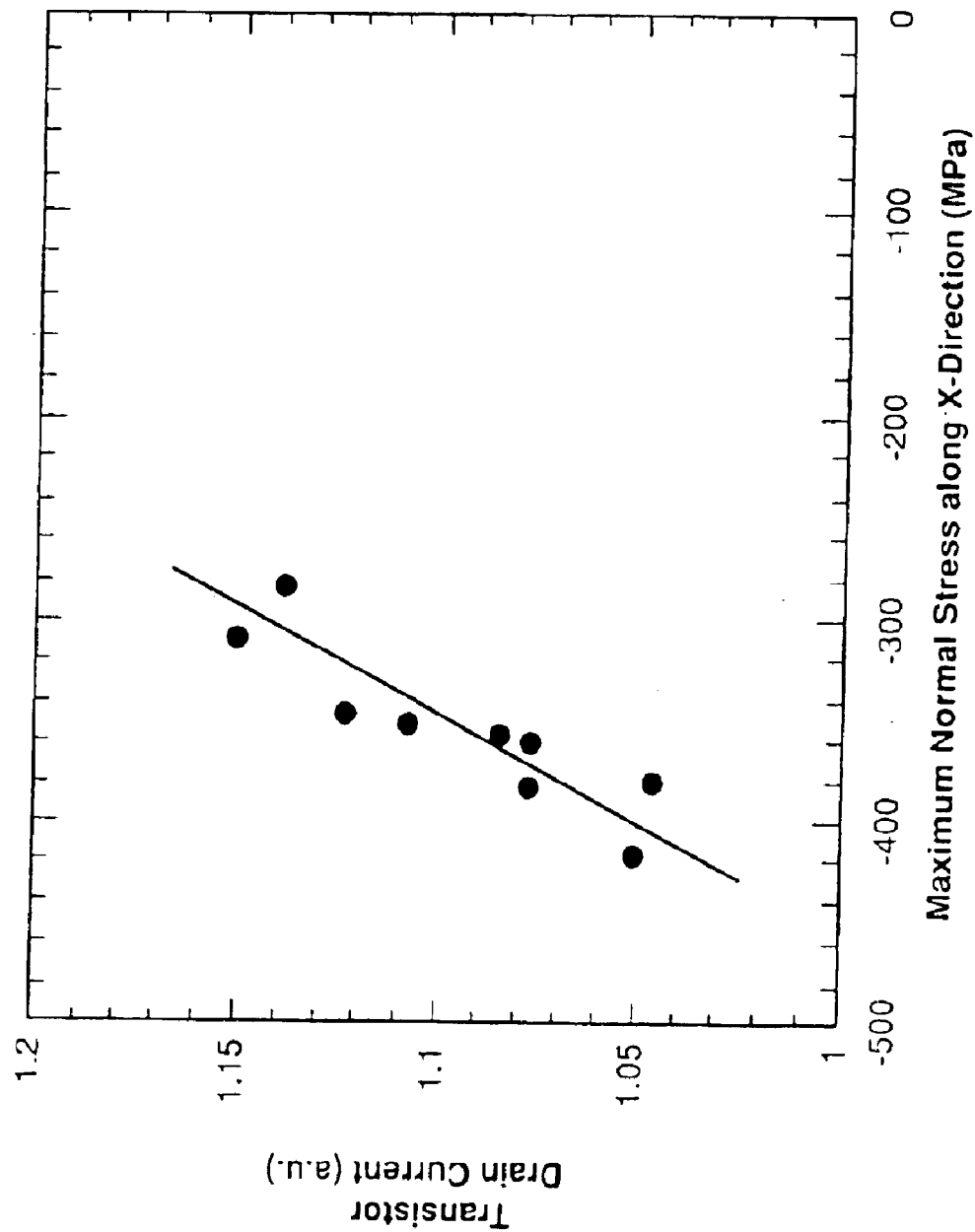
FIG. 2 is a graph illustrating the relationship between the drain current of an n-channel field-effect transistor and stress induced upon the transistor channel.
Figure 3:
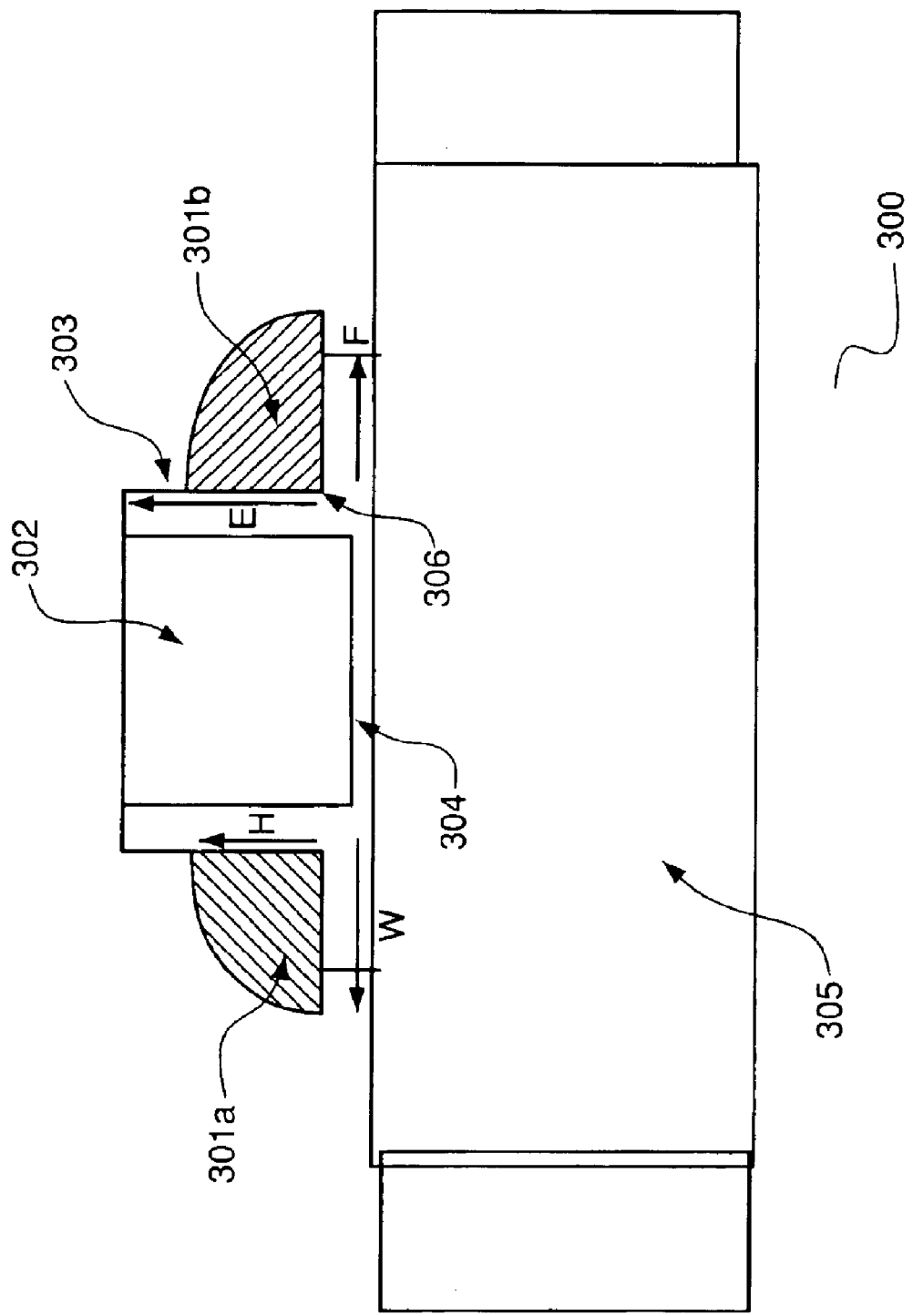
FIG. 3 illustrates a cross-sectional side view of a MOSFET produced in accordance with the first embodiment of the present disclosure.

Referring now to FIG. 3, there is shown a cross-sectional side view of a field-effect transistor structure 300 at a predetermined process step of the first embodiment of the present disclosure. The predetermined process step of the first embodiment is the etching of the spacer layers of the transistor to create recessed spacer structures 301a and 301b after the formation of the transistors' source and drain regions. The transistor's gate region has a gate electrode 302 formed on top of a gate oxide layer 304. The total height of the gate region may not exceed 1800 Å. A relative thin layer of liner film 303 separates the spacers from the gate materials. The spacer layers is typically comprised of silicon nitride as in this embodiment, but may be of any dielectric material having a different material density property than that of the transistors' semiconductor substrate 305. The liner layer 303 typically is comprised of silicon oxide as in this embodiment, but may be of any dielectric material. The liner layer 303 may be referred as a sidewall liner since it clings on to the exterior side walls of the gate electrode. As it is shown, it can be said that there are two sidewall liners for each gate electrode situated on both sides thereof. The sidewall liner is of an "L" shape with a vertical part contacting the side wall of the gate electrode and a horizontal part contacting the substrate. For the purpose of this disclosure, the width W of the spacer is measured from the widest part thereof and the height H of the spacer is measured from the highest part thereof regardless of the shape of the spacer.

In one example, the width of the gate sidewall liner F is shortened to be at least 10 angstrom shorter than the width of the spacer W. Because the gate sidewall liner has a thickness, the width and the height of the gate sidewall liner actually are both measured from the upper corner 306. Shortening the width of the sidewall liner can be done by depositing a layer of oxide over the device, and then etching off the oxide with a controlled timing. When undergoing the etching, the vertical part of the sidewall liner is etched off slower than the horizontal part. As such, when the oxide is totally removed, the horizontal part is "pulled back" from the edges of the spacers.

A spacer etching process to form the recessed spacers may be applied. It can be of any standard method such as wet chemicals or gaseous/plasma etching, or material selective or non-selective etching, as required to sufficiently create the recessed spacers. The result of the spacer etching is to reduce the spacer to a smaller size. In one example, the height of the spacer H is at least 50 angstrom lower than the height of the gate sidewall liner E.

As shown in FIG. 3, the height of the spacers are shrunk to reduce the stress and the horizontal part of the gate sidewall liner contacting the substrate is also shortened for the same purpose. The horizontal part of the sidewall liner is thus "pulled back" from the edge of the corresponding spacer on its top. In one example, the distance between the pull-back edge of the sidewall liner and the edge of the spacer is at least 10 Å. This pull-back distance can be adjusted based on the need of modification of the stress.

In essence, it is this reduction of the spacer layer and the gate sidewall liner that causes reduced stress level upon the electrical gate channel under the gate regions 302 and 304. It is understood that the net stress level reduction depends on both stress changes from the spacer layer itself, as well as from the modified stress from the thickness of other films such as a contact etch stopper (CES) layer subsequently formed on top of the transistors with the recessed spacers. The amount of spacer material reduction may be tailored during the device fabrication processes to obtain the required amount of net stress change and transistor performance.

Figure 4A:
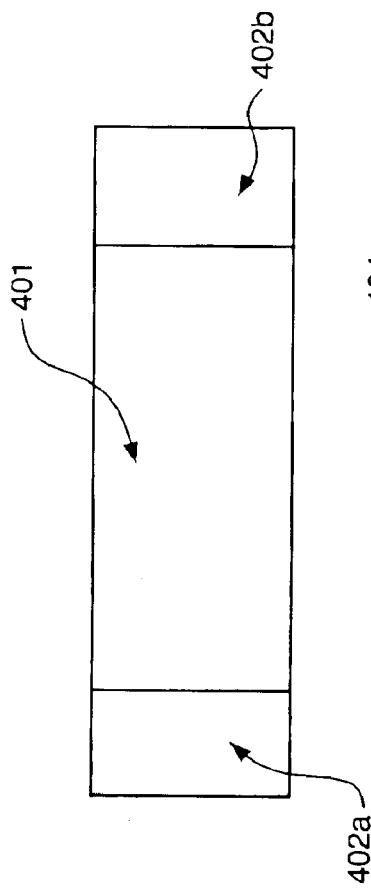
FIGS. 4A through 4E illustrate cross-sectional side views of a MOSFET at certain fabrication steps in accordance with the second embodiment of present disclosure.
Figure 4B:
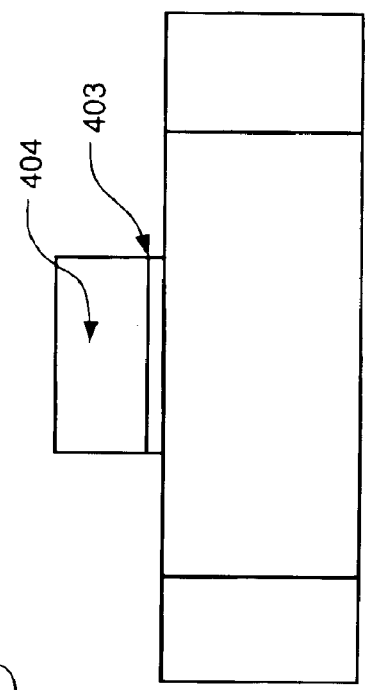
Figure 4C:
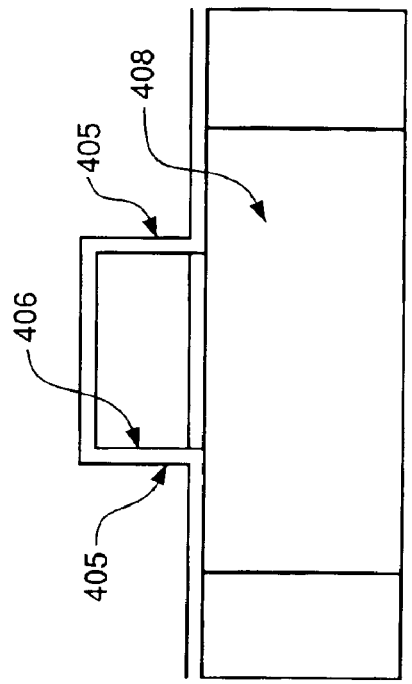

Referring now to FIGS. 4A through 4E, there are shown cross-sectional side views of a field-effect transistor structure at certain process steps. FIG. 4A illustrates a semiconductor surface with silicon substrate 401 and transistor isolation structures 402a and 402b prior to the fabrication of an FET between the isolation structures. The FET's gate, comprising of gate oxide 403 and gate electrode 404, are shown after being fabricated in FIG. 4B. The transistor's sidewall liner layer 405 is subsequently deposited onto the transistor as illustrated in FIG. 4C. FIG. 4C is also the cross-sectional view of the transistor just prior to the deposition of the transistor's spacer layer.

Figure 4D:
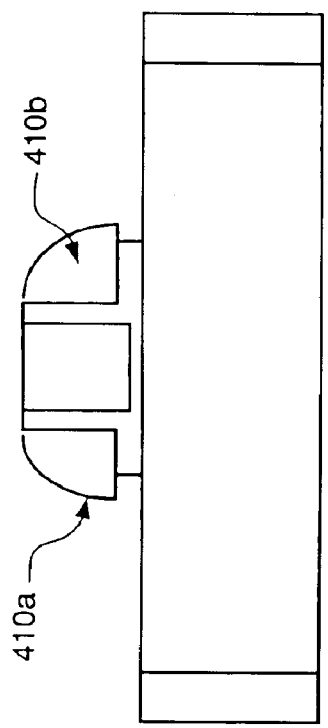

Through necessary etching process, the liner layer around the transistor will have two "L" shaped sidewall liners confining the gate region in between. It can be seen that the sidewall liners have a vertical part that clings to the side wall 406 of the gate electrode and a horizontal part that lies on top of a portion of the substrate 408. FIG. 4D illustrates the cross-sectional view of the transistor after the liner layer has been properly etched and the transistor's spacer layer has been deposited to complete the formation of the isolated spacer structures 410a and 410b around the transistor. At this point, the spacers are generated with the top of the spacers sloping down from the top of the gate sidewall liner down. It is understood that the spacers can deposited first before the "L" shaped sidewall liners are "pulled back" to its desired shortened width.

Figure 4E:
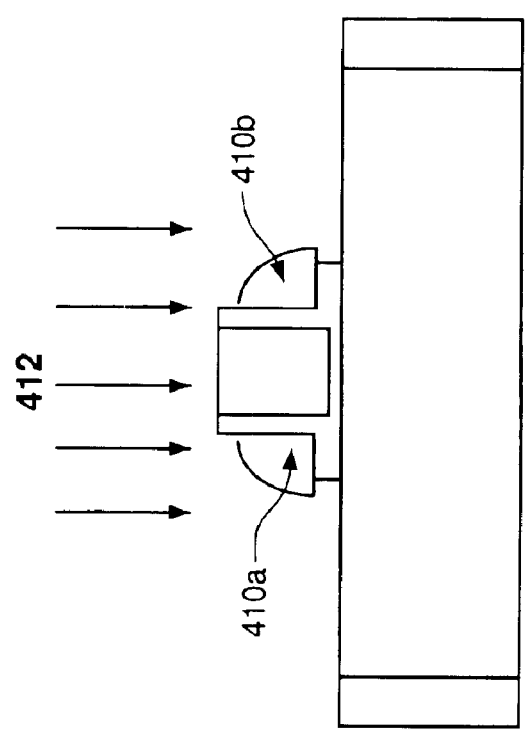

FIG. 4E illustrates the result of further etching processes to make recessed spacers to reduce the channel stress. In this example, the height of the spacers is reduced to be at least 50 Å lower than the original height as shown in FIG. 4D.

In addition, an ion implantation process can be applied to the transistor spacer layers 410a and 410b with a dopant 412 to provide the relaxation of the stress within the spacer layer, thus resulting in a reduction of stress upon the gate channel region. This process step may be performed either before or after the formation of the transistors' source and drain regions. The ion implant species of this embodiment may be silicon or germanium as well as any other ion such as SiN, which will relax the spacer stress while providing minimal affects to other performance characteristics of the device. The ion implant energy of this embodiment is typically in the range of 40 to 100 electron kilovolts for silicon and germanium ions, but may vary depending on different process technologies. The ion implant range is carefully chosen such that placement of the ions within the spacer layer will result in the required modification to the film's stress property. Ion implant dosage of this embodiment is typically in the dose range of 1.00E14 to 1.00E15 ions per square centimeter for silicon and germanium ions. The ion implant dosage level is chosen such that the required stress property modification is made to the spacer layer. The stress relaxation in the spacer layer provided by the ion implantation method results with stress relaxation upon the gate channel region of the transistor which in turn, modifies the drive current performance characteristic of the transistors.

The process order of the etching and implant may not be critical, but it is noted that the implantation of the spacers prior to the etching process to make the recessed spacers may eliminate an undesired additional doping of the transistor's source and drain regions through the exposed liner layer adjacent to the recessed spacers. The combination of both the recessed spacers and relaxed levels of stress by ion implantation within the spacer layers will noticeably reduce the gate channel stress.

It is further noticed that a CES layer can then be processed on top of the recessed spacers to further increase the drive current as it is known in the industry. The thickness of the CES layer can be flexible based on the desired feature of the device. The CES layer may impose a compressive stress as well as a tensile stress depending on the type of the device under construction since N type devices and P type devices require different types of stress to perform in their optimal modes. In one example, the level of the stress imposed by the CES is larger than 200 M Pa, and in another example, the tensile stress imposed by the CES can be as high as 1.5 GPa and the compressive stress may be as high as 1 GPa. Generally speaking, the thickness of the CES layer is smaller than 600 Å, and the CES layer is thicker than the recessed spacers. Having a relatively thick CES layer over the top with a recessed spacers enhances the electron/hole mobility in the gate channel underneath the gate region.

Accordingly, it is seen from the above that the device structure and the method for making same according to the present disclosure provide viable solutions to the problems of hot electron trapping and carrier mobility in the gate channel of an FET device, thereby improving the drive current performance of the transistors. It is also noted that the present disclosure provides a solution for the further shrinkage of FET sizes and densities that are manufactured using conventional process methodologies. It is also seen that the present disclosure provides simplified methods for the modification of the net mechanical stress induced by the shape and property of the transistors' spacer layer upon the gate channel. Devices manufactured in accordance with the present disclosure are easily incorporated in currently existing systems.

The embodiments of the present disclosure may be practiced upon any field-effect transistor, which is fabricated upon a semiconductor substrate with a spacer layer contacts the gate electrode sidewalls via a sidewall liner. The field effect transistors upon which the present disclosure may be practiced may have N doped source/drain electrode regions or P doped source/drain electrode regions. Alternatively, transistor performance of p-channel (PMOS) field-effect transistors may be adjusted to the required performance levels via the stress modification.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A semiconductor device comprising:

a substrate;

a gate region on top of the substrate;

a sidewall liner situated on a side of the gate region and having a vertical part contacting a sidewall of the gate region and a horizontal part contacting the substrate; and a recessed spacer situated on top of the sidewall liner, wherein a height of the recessed spacer is lower than a height of the sidewall liner, wherein the horizontal part of the sidewall liner is shorter than the corresponding recessed spacer on top thereof; and a contact etch stopping (CES) layer formed over the recessed spacer and having a predetermined stress level being one of compressive and tensile.

2. The device of claim 1 wherein the height of the recessed spacer is at least 50 Å lower than the height of the vertical part of the sidewall liner.

3. The device of claim 1 wherein the horizontal part of each gate sidewall liner is at least 10 Å shorter than the recessed spacer.

4. The device of claim 1 wherein the gate region further includes a gate dielectric and electrode layers.

5. The device of claim 4 wherein the height of the gate region does not exceed 1800 Å.

6. The device of claim 1 wherein the recessed spacer is SiN based.

7. The device of claim 1 wherein the recessed spacer further includes Ge, Ar, or $O_2$ based impurities.

8. The device of claim 1 wherein the sidewall liner is oxide based.

9. The device of claim 1 wherein the CES layer imposes a compressive stress.

10. The device of claim 1 wherein the CES layer imposes a tensile stress.

11. The device of claim 1 wherein the stress level of contact etching stopper layer is larger than 200 M Pa.

12. The device of claim 1 wherein the thickness of the CES layer is smaller than 600 Å.

* * * * *